United States Patent
Shih

(10) Patent No.: US 10,637,509 B2
(45) Date of Patent: Apr. 28, 2020

(54) METHODS FOR REDUCING DATA ERRORS IN TRANSCEIVING OF A FLASH STORAGE INTERFACE AND APPARATUSES USING THE SAME

(71) Applicant: Silicon Motion, Inc., Jhubei, Hsinchu County (TW)

(72) Inventor: Fu-Jen Shih, New Taipei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 92 days.

(21) Appl. No.: 16/013,091

(22) Filed: Jun. 20, 2018

(65) Prior Publication Data

US 2019/0007167 A1    Jan. 3, 2019

Related U.S. Application Data

(60) Provisional application No. 62/527,177, filed on Jun. 30, 2017.

(30) Foreign Application Priority Data

Dec. 28, 2017   (TW) .............................. 106146237 A

(51) Int. Cl.
   *H03M 13/35*      (2006.01)
   *H04L 1/00*       (2006.01)
   (Continued)

(52) U.S. Cl.
   CPC ....... *H03M 13/353* (2013.01); *G06F 11/1004* (2013.01); *G06F 13/1668* (2013.01); *H04L 1/0061* (2013.01); *H04L 1/203* (2013.01)

(58) Field of Classification Search
   CPC .......................... H03M 13/356; H03M 13/353
   See application file for complete search history.

(56) References Cited

U.S. PATENT DOCUMENTS 4,764,816 A *  8/1988  Heitmann ............ G11B 5/0086
                                                   360/31
6,182,264 B1 *  1/2001  Ott ........................ H03M 13/09
                                                   714/774
(Continued)

FOREIGN PATENT DOCUMENTS

CN          1825817 A      8/2006
CN        105761753 A      7/2016
(Continued)

OTHER PUBLICATIONS

Universal Flash Storage Association (UFSA). "Introduction to the Universal Flash Storage Association". Jun. 2013.*
(Continued)

*Primary Examiner* — Steve N Nguyen
(74) *Attorney, Agent, or Firm* — McClure, Qualey & Rodack, LLP

(57) ABSTRACT

The invention introduces a method for reducing data errors in transceiving of a flash storage interface, performed by a processing unit of a first side, comprising: continuously monitoring data frames and/or control frames from a second side; and triggering a de-emphasis adjustment when information of the data frame and/or the control frame indicates that the lowest layer of the second side detects errors from received data.

18 Claims, 9 Drawing Sheets

(51) Int. Cl.
*H04L 1/20* (2006.01)
*G06F 13/16* (2006.01)
*G06F 11/10* (2006.01)

(56) References Cited

U.S. PATENT DOCUMENTS

| | | | |
|---|---|---|---|
| 8,127,200 B2 | 2/2012 | Sharon et al. | |
| 8,566,676 B2 | 10/2013 | Palanki et al. | |
| 8,914,696 B2 | 12/2014 | Chen et al. | |
| 9,116,824 B2 | 8/2015 | Sharon et al. | |
| 9,170,744 B1* | 10/2015 | Smith | G06F 9/3814 |
| 9,195,537 B2 | 11/2015 | Sharon et al. | |
| 9,203,391 B2 | 12/2015 | Zhu et al. | |
| 9,348,692 B2 | 5/2016 | Chu | |
| 9,640,281 B1 | 5/2017 | Seo et al. | |
| 2002/0191886 A1* | 12/2002 | Castoldi | G02B 6/12004 |
| | | | 385/14 |
| 2004/0071219 A1* | 4/2004 | Vorenkamp | H04B 3/144 |
| | | | 375/257 |
| 2004/0125767 A1* | 7/2004 | Yu | H04B 7/06 |
| | | | 370/330 |
| 2006/0034358 A1* | 2/2006 | Okamura | H04L 1/205 |
| | | | 375/219 |
| 2008/0034137 A1* | 2/2008 | Whitby-Strevens | |
| | | | G06F 13/387 |
| | | | 710/100 |
| 2008/0175163 A1 | 7/2008 | Honary et al. | |
| 2009/0310408 A1* | 12/2009 | Lee | G11C 11/5628 |
| | | | 365/185.03 |
| 2010/0138725 A1 | 6/2010 | Ikeda | |
| 2010/0183309 A1 | 7/2010 | Etemad et al. | |
| 2010/0329319 A1* | 12/2010 | Dai | G01R 31/3171 |
| | | | 375/224 |
| 2012/0076301 A1 | 3/2012 | Kanter | |
| 2012/0113732 A1 | 5/2012 | Sohn et al. | |
| 2012/0296658 A1 | 11/2012 | Smyth | |
| 2013/0107772 A1* | 5/2013 | Splitz | H04W 56/0015 |
| | | | 370/311 |
| 2013/0142226 A1* | 6/2013 | Sasaki | H04L 25/0272 |
| | | | 375/219 |
| 2014/0031845 A1 | 1/2014 | Rynerson | |
| 2014/0068365 A1 | 3/2014 | Chen et al. | |
| 2014/0156924 A1 | 6/2014 | Jeon et al. | |
| 2014/0173369 A1 | 6/2014 | Chen et al. | |
| 2014/0310536 A1 | 10/2014 | Shoehorn | |
| 2015/0003277 A1 | 1/2015 | Wellington | |
| 2015/0032913 A1* | 1/2015 | Kim | G06F 13/28 |
| | | | 710/24 |
| 2015/0032915 A1 | 1/2015 | Hur et al. | |
| 2016/0028491 A1* | 1/2016 | Oe | H04L 1/0001 |
| | | | 398/209 |
| 2016/0105296 A1* | 4/2016 | Berke | H04L 25/03057 |
| | | | 375/233 |
| 2016/0170824 A1 | 6/2016 | Hamo | |
| 2016/0239235 A1 | 8/2016 | Chung et al. | |
| 2016/0378582 A1* | 12/2016 | Choi | G06F 13/00 |
| | | | 714/37 |
| 2017/0346596 A1* | 11/2017 | Desimone | G06F 11/3051 |
| 2018/0196710 A1 | 7/2018 | Iyer et al. | |
| 2018/0375695 A1 | 12/2018 | Whitby-Strevens | |

FOREIGN PATENT DOCUMENTS

| | | |
|---|---|---|
| CN | 105786749 A | 7/2016 |
| CN | 106850476 A | 6/2017 |
| TW | 200845012 A | 11/2008 |
| TW | 201250462 A | 12/2012 |
| TW | 201304429 A | 1/2013 |
| TW | 201405562 A | 2/2014 |
| TW | 201503153 A | 1/2015 |
| TW | 201506953 A | 2/2015 |

OTHER PUBLICATIONS

Non-Final Office Action dated Oct. 25, 2019, issued in U.S. Appl. No. 16/013,133.

Non-Final Office Action dated Nov. 8, 2019, issued in U.S. Appl. No. 16/013,121.

* cited by examiner

| 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|----|----|----|----|----|----|----|
| RReq | Reserved | | | | NAC | | | | | | ESC_DL | | | | | 1 |
| CCITT CRC-16 | | | | | | | | | | | | | | | | 0 |

FIG. 6

| 16 | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| 1 | ESC_DL | | | | | | | | SOF | | | TC | | Reserved | | | ← 511, 513 |
| 0 | DL_SDU – Byte 0 | | | | | | | | DL_SDU – Byte 1 | | | | | | | | |
| 0 | ... | | | | | | | | | | | | | | | | |
| 0 | DL_SDU – Byte x-2 | | | | | | | | DL_SDU – Byte x-1 | | | | | | | | |
| 1 | ESC_DL | | | | | | | | NAC | | | Reserved | | | RReq | | } 533 |
| 0 | CCITT CRC-16 | | | | | | | | | | | | | | | | |
| 1 | ESC_DL | | | | | | | | COF | | | TC | | Reserved | | | |
| 0 | DL_SDU – Byte (x) | | | | | | | | DL_SDU – Byte (x+1) | | | | | | | | |
| 0 | ... | | | | | | | | | | | | | | | | |
| 0 | DL_SDU – Byte n-2 (n<=DL_MTU) | | | | | | | | DL_SDU – Byte n-1 (n<=DL_MTU) | | | | | | | | |
| 1 | ESC_DL | | | | | | | | EOF_EVEN | | | Frame Seq Number | | | | | |
| 0 | CCITT CRC-16 | | | | | | | | | | | | | | | | |

FIG. 7

METHODS FOR REDUCING DATA ERRORS IN TRANSCEIVING OF A FLASH STORAGE INTERFACE AND APPARATUSES USING THE SAME

CROSS REFERENCE TO RELATED APPLICATIONS

This application claims the benefit of U.S. Provisional Application No. 62/527,177, filed Jun. 30, 2017, the entirety of which is incorporated by reference herein. This Application claims priority of Taiwan Patent Application No. 106146237, filed on Dec. 28, 2017, the entirety of which is incorporated by reference herein.

BACKGROUND

Technical Field

The present invention relates to flash memory, and in particular to methods for reducing data errors in transceiving of a flash storage interface and apparatuses using the same.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. Actually, NAND flash devices usually read or program several pages of data from or into memory cells. In reality, the NAND flash device always reads from the memory cells and writes to the memory cells complete pages. After a page of data is read from the array into a buffer inside the device, the host can access the data bytes or words one by one by serially clocking them out using a strobe signal.

A flash memory device typically contains a device side and a storage unit and connects to a host side via a flash storage interface. As advances have been made in the data transmission rate of flash storage interfaces, data errors have occurred more frequently. Accordingly, what is needed are methods for reducing data errors in transceiving of a flash storage interface and apparatuses that use these methods.

BRIEF SUMMARY

An embodiment of the invention introduces a method for reducing data errors in transceiving of a flash storage interface, performed by a processing unit of a first side, comprising: continuously monitoring data frames and/or a control frames from a second side; and triggering a de-emphasis adjustment when information of the data frame and/or the control frame indicates that the lowest layer of the second side detects errors from received data.

An embodiment of the invention introduces an apparatus for reducing data errors in transceiving of a flash storage interface at least including the lowest layer coupled to a peer side, and a processing unit coupled to the lowest layer. The processing unit continuously monitors data frames and/or a control frames from the peer side; and triggers a de-emphasis adjustment when information of the data frame and/or the control frame indicates that the lowest layer of the peer side detects errors from received data.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein:

FIG. 6 illustrates the data structure of a NAC frame according to an embodiment of the invention.

FIG. 7 illustrates a data frame with preemption of a NAC frame according to an embodiment of the invention.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
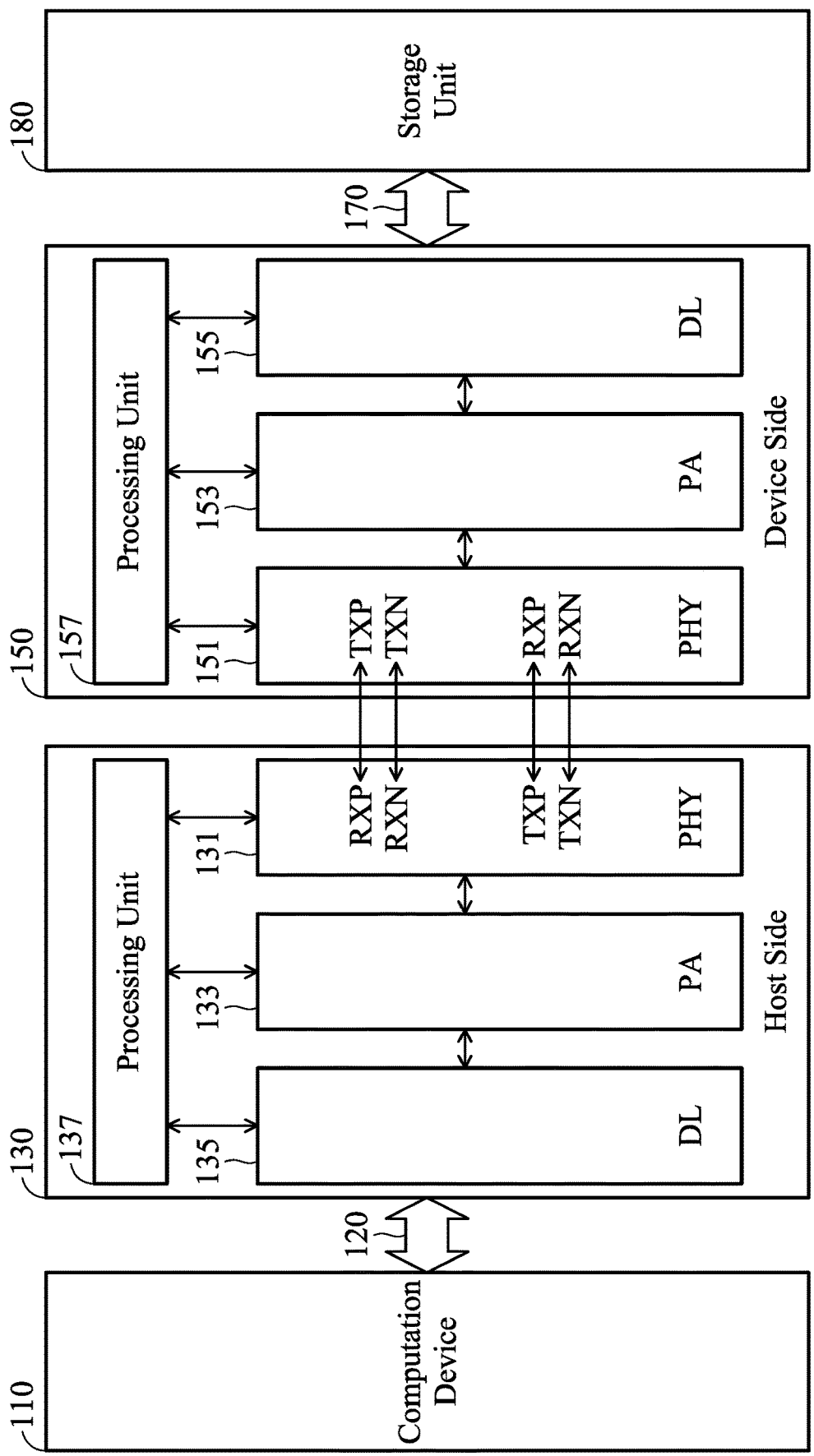
FIG. 1 is the system architecture for a flash memory according to an embodiment of the invention.

FIG. 1 is the system architecture for a flash memory according to an embodiment of the invention. The systems architecture of the flash memory may contain a host side 130 that communicates with a device side 150 through a UFS (Universal Flash Storage) interface. UFS is a common flash storage specification to bring higher data transfer speed and increased reliability to flash memory storage and remove the need for different adapters for different types of flash storage units. The flash memory may be equipped with a digital camera, a mobile phone, a consumer electronic device or others. The UFS interface may operate at PWM (Pulse-Width Modulation) and HS (high-speed) gears. The PWM gear may be 0.5 Gbps or lower while the HS gear may be 1.4 Gbps or higher. The PWM gear may be referred to as a low speed gear. For example, the data rates of different HS-GEARs defined in the UFS specification are listed in Table 1:

TABLE 1

| RATE A-series (Mbps) | RATE B-series (Mbps) | High-Speed GEARs |
|---|---|---|
| 1248 | 1457.6 | HS-G1 (A/B) |
| 2496 | 2915.2 | HS-G2 (A/B) |
| 4992 | 5830.4 | HS-G3 (A/B) |

For example, the rate A of HS-G1 gear is 1248 Mbps (megabits per second), the rate B of HS-G1 gear is 1457.6 Mbps, the rate A of HS-G2 gear is 2496 Mbps, the rate B of HS-G2 gear is 2915.2 Mbps, the rate A of HS-G3 gear is 4992 Mbps and the rate B of HS-G3 gear is 5830.4 Mbps. The data rates of different PWM-GEARs defined in the UFS specification are listed in Table 2:

TABLE 2

| PWM-GEARs | Min. (Mbps) | Max. (Mbps) |
|---|---|---|
| PWM-G0 | 0.01 | 3 |
| PWM-G1 | 3 | 9 |
| PWM-G2 | 6 | 18 |
| PWM-G3 | 12 | 36 |
| PWM-G4 | 24 | 72 |
| PWM-G5 | 48 | 144 |
| PWM-G6 | 96 | 288 |
| PWM-G7 | 192 | 576 |

For example, the data rate of PWM-G0 gear is ranging from 0.01 to 3 Mbps, the data rate of PWM-G1 is ranging from 3 to 9 Mbps, the data rate of PWM-G2 is ranging from 6 to 18 Mbps, and the rest can be deduced according to Table 2.

The flash memory further contains a storage unit 180 and the device side 150 may communicate with the storage unit 180 using a DDR (Double Data Rate) protocol, such as ONFI (open NAND flash interface), DDR toggle, or others. Specifically, a processing unit 157 of the device side 150 writes data into a designated address of a storage unit 180, and reads data from a designated address thereof through the access interface 170. The access interface 170 uses several electrical signals for coordinating commands and data transfer between the processing unit 157 of the device side 150 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc.

Figure 2:
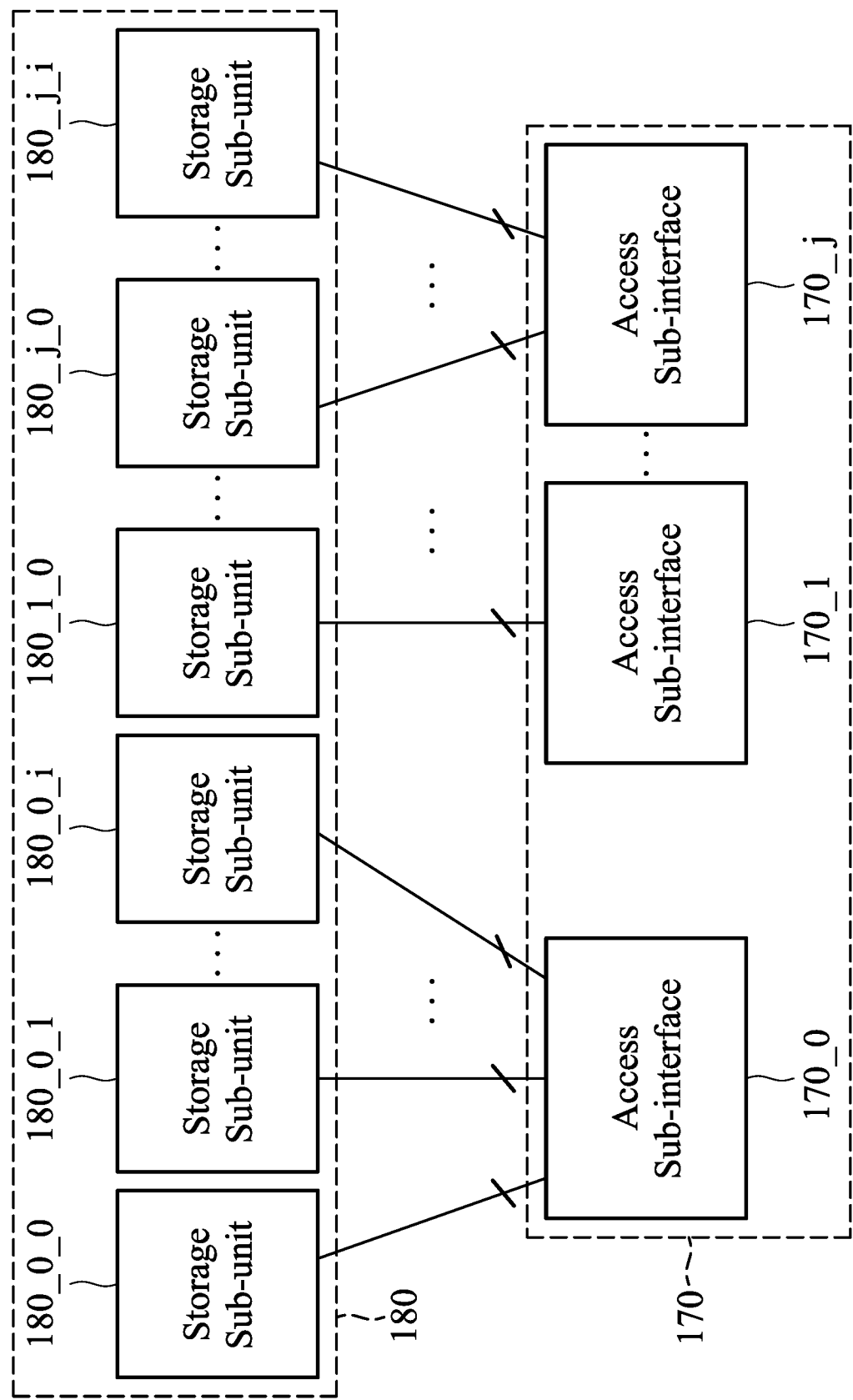
FIG. 2 is a schematic diagram illustrating interfaces to storage units of a flash storage according to an embodiment of the invention.
Figure 3:
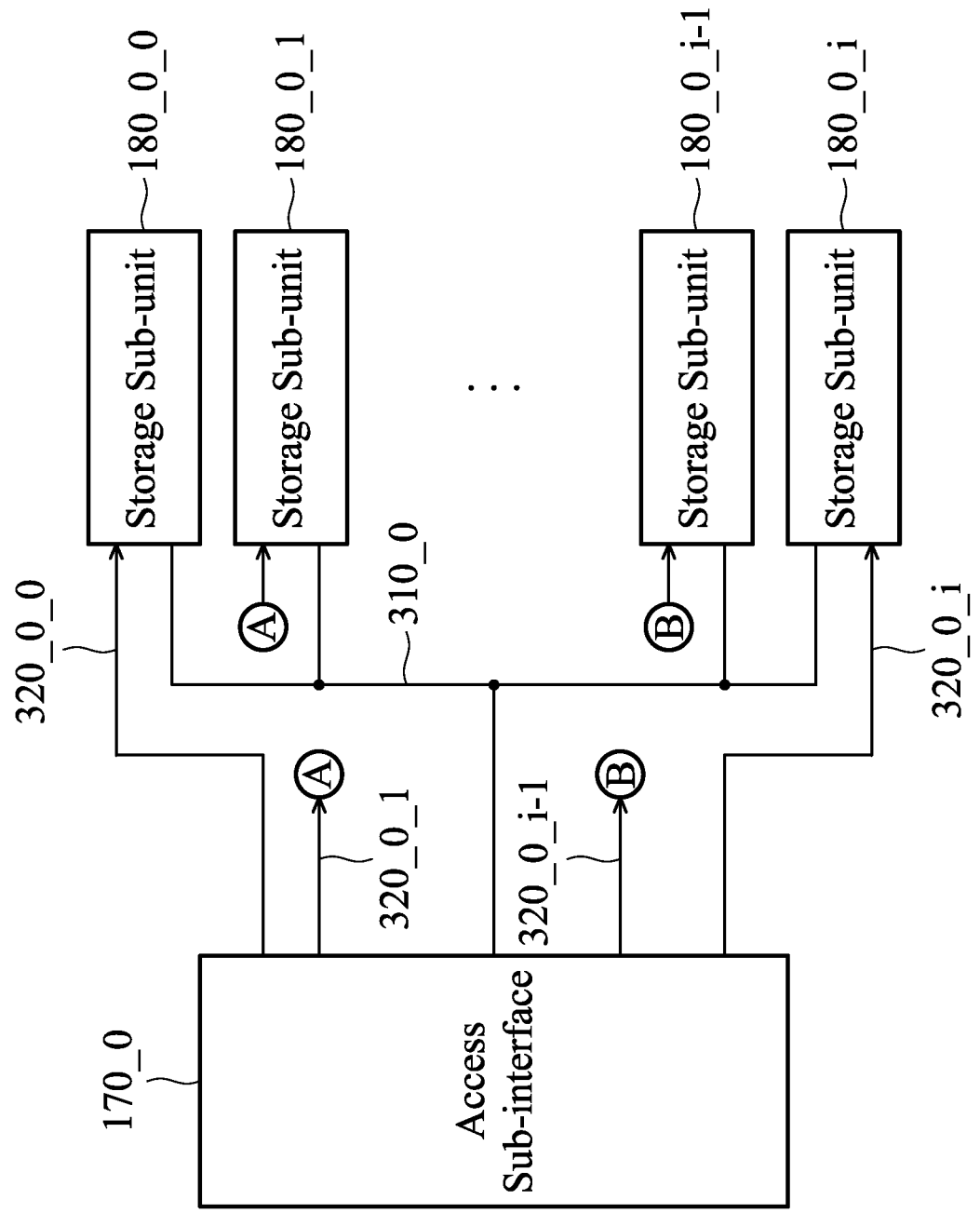
FIG. 3 is a schematic diagram depicting connections between one access sub-interface and multiple storage sub-units according to an embodiment of the invention.

The storage unit 180 may contain multiple storage sub-units and each storage sub-unit may be practiced in one or more dies and use an access sub-interface to communicate with the processing unit 157. FIG. 2 is a schematic diagram illustrating interfaces to storage units of a flash storage according to an embodiment of the invention. The flash memory may contain j+1 access sub-interfaces 170_0 to 170_j, where the access sub-interfaces may be referred to as channels, and each access sub-interface connects to i+1 storage sub-units. That is, i+1 storage sub-units may share the same access sub-interface. For example, assume that the flash memory contains 4 channels (j=3) and each channel connects to 4 storage sub-units (i=3): The flash memory has 16 storage sub-units 180_0_0 to 180_j_i in total. The computation device 110 may direct one of the access sub-interfaces 170_0 to 170_j to read data from the designated storage sub-unit. Each storage sub-unit has an independent CE control signal. That is, it is required to enable a corresponding CE control signal when attempting to perform data read or programming from or into a designated storage sub-unit via an associated access sub-interface. It is apparent that any number of channels may be provided in the flash memory, and each channel may be associated with any number of storage sub-units, and the invention should not be limited thereto. FIG. 3 is a schematic diagram depicting connections between one access sub-interface and multiple storage sub-units according to an embodiment of the invention. The processing unit 157, through the access sub-interface 170_0, may use independent CE control signals 320_0_0 to 320_0_i to select one of the connected storage sub-units 180_0_0 and 180_0_i, and then read data from or program data into the designated location of the selected storage sub-unit via the shared data line 310_0.

The processing unit 137 of the host side 130 may communicate with a computation device 110 through a standard protocol, such as USB (Universal Serial Bus), ATA (Advanced Technology Attachment), SATA (Serial ATA), PCI-E (Peripheral Component Interconnect Express) or others.

The host side 130 and the device side 150 may contain UIC (UFS Interconnect) layers, respectively. UIC layer is the lowest layer of UFS layered architecture and handles connections between the host side 130 and the device side 150. The UIC layer of the host side 130 may contain a PHY (physical) (L1) layer 131, a PA (physical adapter) (L1.5) layer 133 and a DL (data link) (L2) layer 135. The UIC layer of the device side 150 may contain a PHY (L1) layer 151, a PA (L1.5) layer 153 and a DL (L2) layer 155. Each of the PHY layers 131 and 151 may use a differential output pair (such as, TXP and TXN as shown in FIG. 1) to transmit data to a peer side and a differential input pair (such as, RXP and RXN as shown in FIG. 1) to receive data from the peer side. For example, the PHY layer 131 of the host side 130 may transmit data to the device side 150 via the differential output pair and receive data from the device side 150 via the differential input pair. On the other hand, the PHY layer 151 of the device side 150 may transmit data to the host side 130 via the differential output pair and receive data from the host side 130 via the differential input pair.

Figure 4:
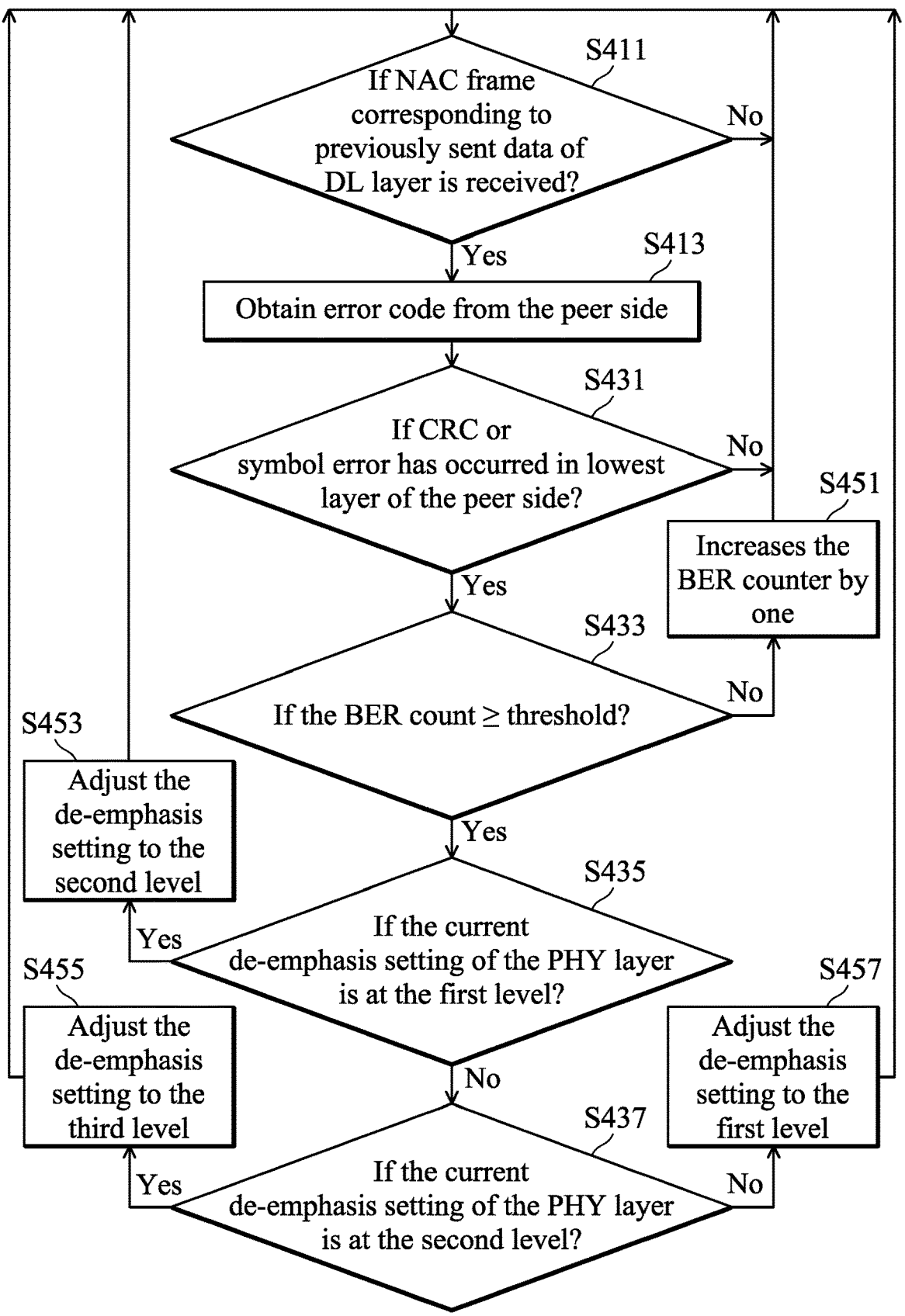
FIG. 4 is a flowchart illustrating a method for adjusting a de-emphasis setting when a host side and a device side operate at a high speed gear according to an embodiment of the invention.
Figure 5:
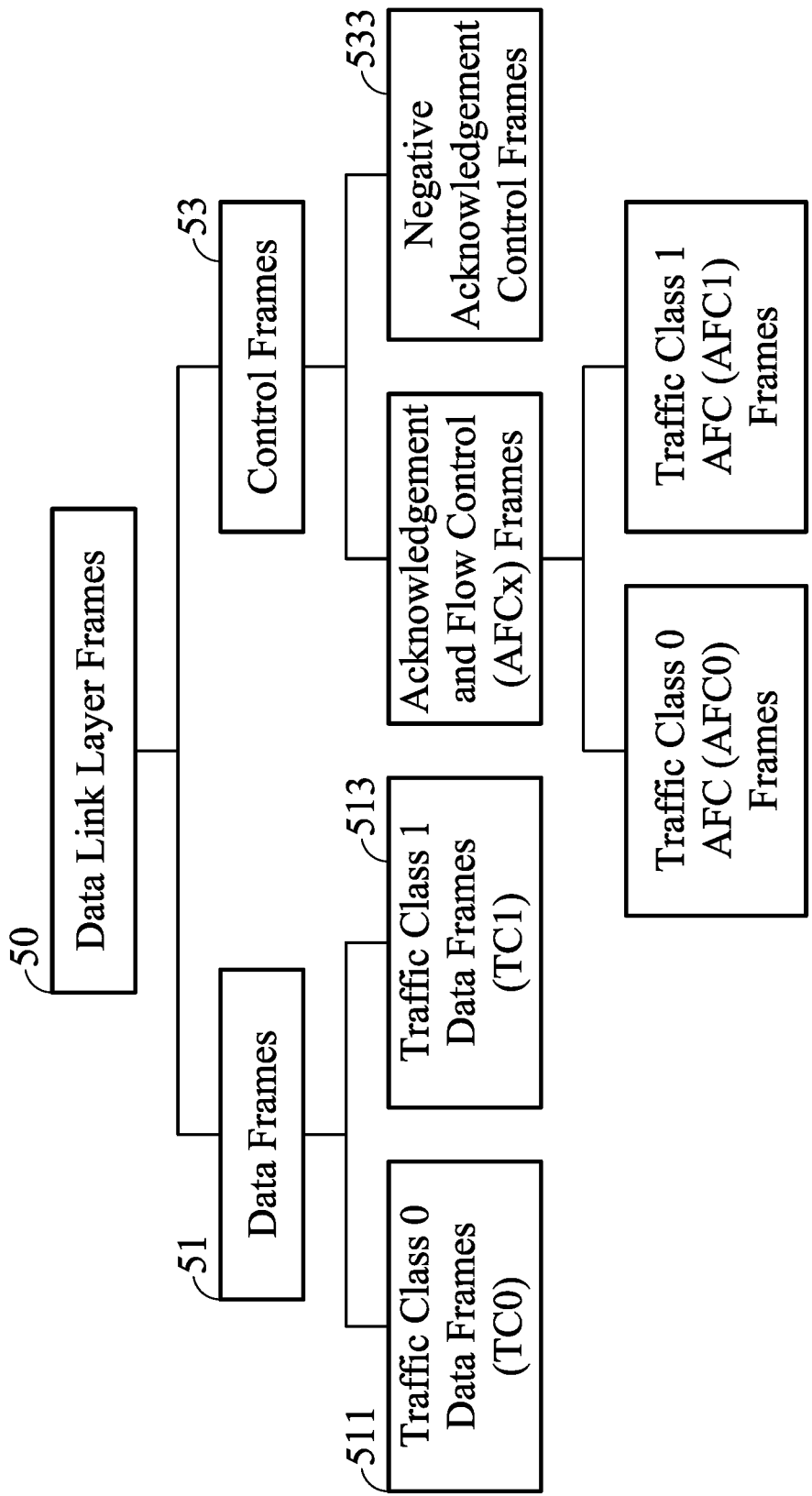
FIG. 5 illustrates taxonomy of control and data frames according to an embodiment of the invention.

When the host side 130 and the device side 150 operate at a high speed gear, ISI (Intersymbol Interference) may happen. Any of the host side 130 and the device side 150 (also referred to as a transmitter side) may continuously monitor data frames and/or control frames from the peer side via the lowest layer and trigger a de-emphasis adjustment to reduce ISI when a predefined condition has satisfied. The predefined condition may indicate that the lowest layer of the peer side operating at a high speed gear detects errors from the received data. For example, the host side 130 may continuously monitor data frames and/or control frames from the device side 150 and trigger a de-emphasis adjustment when one received data frame and/or one received control frame indicates that the UIC layer of the device side 150 operating at a high speed gear detects errors from data received from the host side 130, and vice versa. The de-emphasis setting may be adjusted to 0 dB, 3.5 dB or 6 dB. FIG. 4 is a flowchart illustrating a method for adjusting a de-emphasis setting when a host side and a device side operate at a high speed gear according to an embodiment of the invention. The method may be realized when the processing unit 137 or 157 loads and executes relevant microcodes or software instructions. De-emphasis may be implemented in hardware circuits of the PHY layer of the transmitter side to decrease the magnitude of higher frequencies with respect to the magnitude of other frequencies in order to improve the overall signal-to-noise ratio by minimizing the adverse effects of such phenomena as attenuation differences or saturation of recording media. An embodiment of a method for adjusting a de-emphasis setting may be performed by the processing unit 137 of the host side 130 or the processing unit 157 of the device side 150 (collectively referred to as the processing unit of the transmitter side), such as a general-purpose processor, a microcontroller, a MCU (microcontroller unit), etc., when loading and executing the relevant firmware of a non-volatile memory of the transmitter side. The processing unit of the transmitter side may continuously monitor data or control frames received via the differential input pair from the other side (referred to as a receiver side or a peer side) and determine whether a NAC (Negative Acknowledgement Control) frame corresponding to data that is previously sent by the DL Layer of the transmitter side is received. FIG. 5 illustrates taxonomy of control and data frames according to an embodiment of the invention. DL layer frames 50 may be classified into two types: data frames (TCx) 51 and control frames 53. The data frames may be classified into two types: TC0 (Traffic Class 0 Data Frames) and TC1 (Traffic Class 1 Data Frames). NAC frames are included in a family of control frames that can be comprehended or parsed by logics (hardware circuits) of the DL layer of the transmitter side. The NAC control frame is sent to the transmitter side when the receiver side detects an error in any frame or receives a data frame with a wrong FSN (Frame Sequence Number). FIG. 6 illustrates the data structure of a NAC frame according to an embodiment of the invention. The length of the NAC frame 533 is two symbols and each symbol is 16 bits. The NAC frame 533 includes an RReq bit (the $0^{th}$ bit of the $0^{th}$ symbol) for requesting the transmitter side for reinitializing the transmission portion of the PHY layer thereof. The NAC frame 533 may be protected by CCITT CRC-16 checksum 63 (the $1^{st}$ symbol). FIG. 7 illustrates a data frame with preemption of a NAC frame according to an embodiment of the invention. In some embodiments, the NAC frame 533 may be carried in a data frame 511 or 513 by preempting DL SDU bytes with the NAC frame 533.

Figure 8:
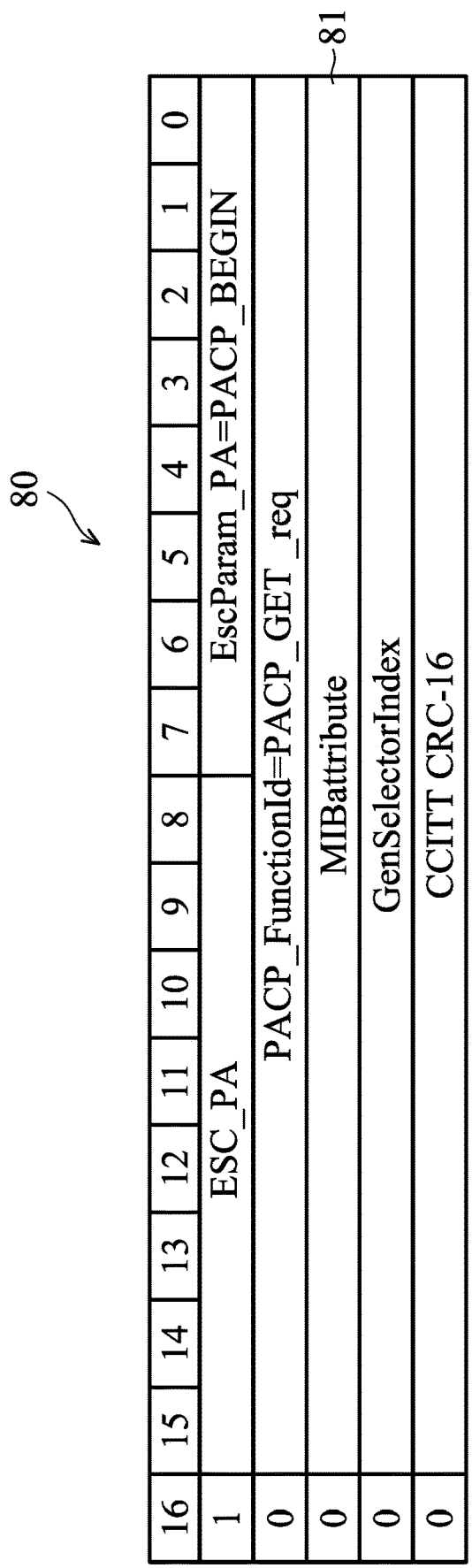
FIG. 8 illustrates the data structure of a PACP_GET_req frame according to an embodiment of the invention.

Errors of the previously sent data detected by the peer side are not necessarily caused by the high speed gear at which the UIC layers operate. Therefore, further examination is required to avoid unnecessary de-emphasis adjustment. Refer to FIG. 4. When a NAC frame corresponding to previously sent data of the DL layer is received (the "Yes" path of step S411), the processing unit of the transmitter side issues a request to the peer side to obtain possible causes associated with the NAC frame and receives a response from the peer side (step S413). The request may be PACP_GET_req defined in the UFS specification. FIG. 8 illustrates the data structure of a PACP_GET_req frame according to an embodiment of the invention. The PACP_GET_req frame 80 includes the MIBattribute field (the $2^{nd}$ symbol) 81 defining which attributes of the peer side are requested to be obtained. The MIBattribute field of the request may store one or more error codes to be obtained. The response may contain an error code indicates an error type in case an error event occurs in the DL layer of the peer side. In some embodiments, the error code may be carried in the DLErrorCode enumeration of the DL_LM_SAP status primitive. Table 1 lists exemplary parameters of the DL_LM_SAP status primitive:

TABLE 1

| Name | Type | Valid Range | Value |
| --- | --- | --- | --- |
| DLErrorCode | Enumeration | NAC_RECEIVED | 1 |
| | | TCx_REPLAY_TIMER_EXPIRED | 2 |
| | | AFCx_REQUEST_TIMER_EXPIRED | 3 |
| | | FCx_PROTECTION_TIMER_EXPIRED | 4 |
| | | CRC_ERROR | 5 |
| | | RX_BUFFER_OVERFLOW | 6 |
| | | MAX_FRAME_LENGTH_EXCEEDED | 7 |
| | | WRONG_SEQUENCE_NUMBER | 8 |
| | | AFC_FRAME_SYNTAX_ERROR | 9 |
| | | NAC_FRAME_SYNTAX_ERROR | 10 |
| | | EOF_SYNTAX_ERROR | 11 |
| | | FRAME_SYNTAX_ERROR | 12 |
| | | BAD_CTRL_SYMBOL_TYPE | 13 |
| | | PA_INIT_ERROR | 14 |
| | | PA_ERROR_IND_RECEIVED | 15 |

For example, the error code DLErrorCode=5 indicates a CRC (Cyclic redundancy check) error has occurred in the PA layer of the peer side. The error code DLErrorCode=13 indicates a symbol error has occurred in the PHY layer of the peer side.

Refer to FIG. 4. After receiving the response (or fetching an error code) from the peer side (step S413), the processing unit of the transmitter side determines whether a CRC error or a symbol error has occurred in the lowest layer of the peer side (step S431). Since the error in the peer side may be happened occasionally, the processing unit of the transmitter side may maintain a BER (Bit Error Rate) counter (initialized to 1) for recording the total number of occurrences of CRC errors and/or the symbol errors. After detecting that the CRC/symbol errors have occurred at least two times, the de-emphasis setting is adjusted. When a CRC error or a symbol error has occurred in the lowest layer of the peer side (the "Yes" path of step S431), the processing unit of the transmitter side further determines whether the BER count reaches or is greater than a predefined threshold (e.g. an arbitrary integer ranging from 2 to 10) (step S433). When the BER count is lower than the predefined threshold (the "No" path of step S433), the process increases the BER counter by one (step S451) and performs the determination for the next potential NAC frame (step S411). When the BER count reaches or is greater than a predefined threshold (the "Yes" path of step S433), the processing unit of the transmitter side adjusts a de-emphasis setting of the PHY layer of the transmitter side, so as to transmit data frames with a new de-emphasis level in the future (steps S435, S437, S453, S455 and S457). Details of the de-emphasis adjustment are described as follows: When the current de-emphasis setting of the PHY layer of the transmitter side is at a first level (the "Yes" path of step S435), the processing unit of the transmitter side directs the PHY layer of the transmitter side to adjust the de-emphasis setting to a second level (step S453). When the current de-emphasis setting of the PHY layer of the transmitter side is at the second level (the "Yes" path of the step S437 followed by the "No" path of step S435), the processing unit of the transmitter side directs the PHY layer of the transmitter side to adjust the de-emphasis setting of the PHY layer of the transmitter side to a third level (step S455). When the current de-emphasis setting of the PHY layer of the transmitter side is at the third level (the "No" path of step S437 followed by the "No" path of step S435), the processing unit of the transmitter side directs the PHY layer of the transmitter side to adjust the de-emphasis setting to the first level (step S455). The first level is lower than the second level and the second level is lower than the third level. In some embodiments, the first level is 0 dB, the second level is 3.5 dB and the third level is 6 dB. It should be noted that the de-emphasis setting of the PHY layer of the transmitter side at a higher level yields a greater magnitude degradation of high frequencies than that at a lower level. It should be further noted that, when the current de-emphasis setting of the PHY layer of the transmitter side is at the third level, a further de-emphasis adjustment of the PHY layer of the transmitter side is useless and the PHY layer of the transmitter side may need to adjust a parameter other than the de-emphasis setting to enhance transmission reliability at a high speed gear. It should be further noted that each of steps S453, S455 and S457 additionally resets the BER counter to 1.

Figure 9:
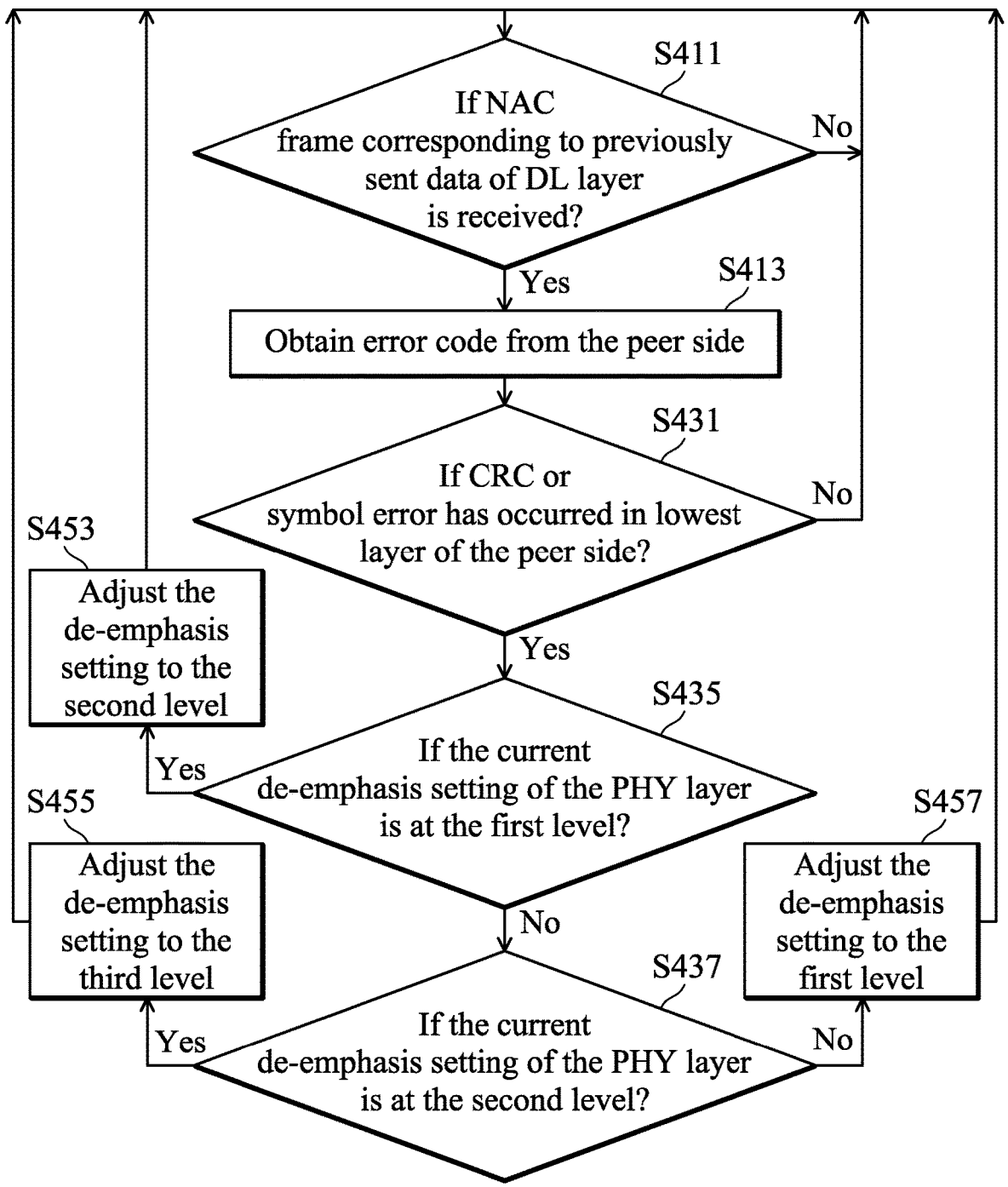
FIG. 9 is a flowchart illustrating a method for adjusting a de-emphasis setting according to an embodiment of the invention.

FIG. 9 is a flowchart illustrating a method for adjusting a de-emphasis setting according to an embodiment of the invention. Overall, the flowchart of FIG. 9 omits the maintenance of the BER counter as shown in FIG. 4. Specifically, when receiving a NAC frame corresponding to previously sent data and detecting that a CRC or symbol error has occurred in the lowest layer of the peer side (the "Yes" path of step S431 followed by the "Yes" path of step S411), the processing unit of the transmitter side adjusts a de-emphasis setting of the PHY layer of the transmitter side, so as to transmit data frames with a new de-emphasis level in the future.

Although the embodiment has been described as having specific elements in FIGS. 1 to 3, it should be noted that additional elements may be included to achieve better performance without departing from the spirit of the invention. While the process flows described in FIGS. 4 and 9 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for reducing data errors in transceiving of a flash storage interface, performed by a processing unit of a first side, comprising:
   continuously monitoring data frames and/or control frames from a second side; and
   triggering a de-emphasis adjustment when information of a data frame and/or a control frame indicates that a lowest layer of the second side detects errors from received data, wherein the lowest layer is a UIC (UFS Interconnect) layer,
   wherein the de-emphasis adjustment comprises:
   directing a PHY (Physical) layer of the first side to adjust a de-emphasis setting of the PHY layer of the first side to a second level when the de-emphasis setting is at a first level;
   directing the PHY layer of the first side to adjust the de-emphasis setting of the PHY layer of the first side to a third level when the de-emphasis setting is at the second level; and
   directing the PHY layer of the first side to adjust the de-emphasis setting of the PHY layer of the first side to the first level when the de-emphasis setting is at the third level.

2. The method of claim 1, wherein the first side communicates with the second side via a UFS (Universal Flash Storage) interface.

3. The method of claim 2, wherein the UIC layer comprises a PHY (physical) layer and a PA (physical adapter) layer, the method comprising:
   triggering the de-emphasis adjustment when an error code sent by the second side indicates a CRC (Cyclic redundancy check) error has occurred in the PA layer of the second side or a symbol error has occurred in the PHY layer of the second side in data reception.

4. The method of claim 3, comprising:
   issuing a request to the second side to obtain a cause associated with a NAC (Negative Acknowledgement Control) frame when receiving the NAC frame corresponding to previously sent data of a DL (Data Link) layer; and
   receiving a response from the second side, which comprises the error code.

5. The method of claim 2, wherein the UFS interface operates at 1.4 Gbps or higher.

6. The method of claim 2, wherein the UIC layer comprises a PHY (physical) layer and a PA (physical adapter) layer and the processing unit maintains a BER (Bit Error Rate) counter for recording the total number of occurrences of errors in data reception by the PHY layer and the PA layer of the second side, the method comprising:
   determining whether a BER count reaches or is greater than a threshold when an error code sent by the second side indicates a CRC (Cyclic redundancy check) error has occurred in the PA layer of the second side or a symbol error has occurred in the PHY layer of the second side in data reception; and triggering the de-emphasis adjustment when the BER count reaches or is greater than the threshold.

7. The method of claim 6, wherein the threshold is an integer ranging from 2 to 10.

8. The method of claim 1, wherein the first level is 0 dB, the second level is 3.5 dB and the third level is 6 dB.

9. The method of claim 1, wherein the de-emphasis setting of the PHY layer of the first side at a higher level yields a greater magnitude degradation of high frequencies than that at a lower level.

10. An apparatus for reducing data errors in transceiving of a flash storage interface, comprising:
a lowest layer, coupled to a peer side; and
a processing unit, coupled to the lowest layer, continuously monitoring data frames and/or control frames from the peer side; and triggering a de-emphasis adjustment when information of a data frame and/or a control frame indicates that a lowest layer of the peer side detects errors from received data, wherein the lowest layer is a UIC (UFS Interconnect) layer,
wherein the de-emphasis adjustment comprises:
directing a PHY (Physical) layer of the first side to adjust a de-emphasis setting of the PHY layer of the first side to a second level when the de-emphasis setting is at a first level;
directing the PHY layer of the first side to adjust the de-emphasis setting of the PHY layer of the first side to a third level when the de-emphasis setting is at the second level; and
directing the PHY layer of the first side to adjust the de-emphasis setting of the PHY layer of the first side to the first level when the de-emphasis setting is at the third level.

11. The apparatus of claim 10, wherein the apparatus communicates with the peer side via a UFS (Universal Flash Storage) interface.

12. The apparatus of claim 11, wherein the UIC layer comprises a PHY (physical) layer and a PA (physical adapter) layer and the processing unit triggers the de-emphasis adjustment when an error code sent by the peer side indicates a CRC (Cyclic redundancy check) error has occurred in the PA layer of the peer side or a symbol error has occurred in the PHY layer of the peer side in data reception.

13. The apparatus of claim 12, wherein the processing unit issues a request to the peer side to obtain a cause associated with a NAC (Negative Acknowledgement Control) frame when receiving the NAC frame corresponding to previously sent data of a DL (Data Link) layer; and receives a response from the peer side, which comprises the error code.

14. The apparatus of claim 11, wherein the UFS interface operates at 1.4 Gbps or higher.

15. The apparatus of claim 11, wherein the UIC layer comprises a PHY (physical) layer and a PA (physical adapter) layer and the processing unit maintains a BER (Bit Error Rate) counter for recording the total number of occurrences of errors in data reception by the PHY layer and the PA layer of the peer side, determines whether a BER count reaches or is greater than a threshold when an error code sent by the peer side indicates a CRC (Cyclic redundancy check) error has occurred in the PA layer of the peer side or a symbol error has occurred in the PHY layer of the peer side in data reception; and triggers the de-emphasis adjustment when the BER count reaches or is greater than the threshold.

16. The apparatus of claim 15, wherein the threshold is an integer ranging from 2 to 10.

17. The apparatus of claim 10, wherein the first level is 0 dB, the second level is 3.5 dB and the third level is 6 dB.

18. The apparatus of claim 10, wherein the de-emphasis setting of the PHY layer of the apparatus at a higher level yields a greater magnitude degradation of high frequencies than that at a lower level.

* * * * *